(12) United States Patent
Massei

(10) Patent No.: US 6,750,702 B2
(45) Date of Patent: Jun. 15, 2004

(54) LIMITING AMPLIFIER

(75) Inventor: Myriam Massei, Saint Laurent Du Var (FR)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/325,792

(22) Filed: Dec. 19, 2002

(65) Prior Publication Data

US 2003/0117213 A1 Jun. 26, 2003

(30) Foreign Application Priority Data

Dec. 21, 2001 (EP) .............................. 01480147

(51) Int. Cl.[7] .................................................. G06G 7/12
(52) U.S. Cl. ...................................... 327/563; 330/252
(58) Field of Search ................................ 327/560, 563, 327/561, 800, 351, 437; 330/252, 250

(56) References Cited

U.S. PATENT DOCUMENTS

| | | | |
|---|---|---|---|
| 3,745,374 A | 7/1973 | Hecker et al. | 327/301 |
| 4,198,602 A * | 4/1980 | Nishijima et al. | 32/350 |
| 4,571,502 A | 2/1986 | Kimura et al. | 327/104 |
| 5,349,521 A | 9/1994 | Menegoli et al. | 363/81 |
| 5,570,055 A * | 10/1996 | Gilbert | 327/350 |
| 6,229,375 B1 * | 5/2001 | Koen | 327/351 |

OTHER PUBLICATIONS

Huang, et al., "A 2-V 10.7-MHz CMOS Limiting Amplifier/RSSI," in the IEEE Journal of Solid-State Circuits, vol. 35, No. 10, Oct., 2000.

* cited by examiner

*Primary Examiner*—Dinh T. Le
(74) *Attorney, Agent, or Firm*—Margaret A. Pepper

(57) ABSTRACT

A limiting amplifier comprises a differential amplifying stage combined with a differential output stage. The limiting amplifier is characterized in that a first and a second resistor means are coupled to the differential amplifying stage and to the differential output stage. The proposed arrangement leads to a constant gain ratio thereby providing a gain circuit that is independent over the process and the temperature variations.

10 Claims, 3 Drawing Sheets

LIMITING AMPLIFIER

TECHNICAL FIELD

The present invention relates to the field of limiting amplifiers.

BACKGROUND OF THE INVENTION

In wireless communication systems, such as cellular telephones, one of the significant problems is the fading phenomenon which causes fluctuations in the received signal's amplitude and phase which results in having a signal that has a wide dynamic range. At the receiving side, the received signal is handled by a receiver block that generally includes a gain amplifying chain which is adjusted to saturate the received signal at a relatively constant amplitude. To achieve this, the amplitude of the analog received signal is evaluated and converted into a digital word through an analog to digital (A/D) converter, and next the digital word feeds a Digital Signal Processor (DSP) to control back the gain of the amplifier circuit.

A direct A/D conversion may require the use of a large number of bits to represent the variation. As an example for an amplitude that varies from 500 $\mu$V to 500 mV, if a common A/D converter is used (i.e., a circuit having a LSB<500 $\mu$V), the number N of bits is at least N=10.

A known solution to reduce N is to compress the received signal by employing a logarithmic amplifier in a successive approximation. U.S. Pat. No. 3,745,374 describes a basic implementation of such facility. In Huang, et al., "A 2-V 10.7-MHz CMOS Limiting Amplifier/RSSI," in the IEEE JOURNAL OF SOLID-STATE CIRCUITS, Vol. 35 No. 10, October, 2000, a logarithmic architecture is described in FIG. 2. The circuit is composed of a limiting amplifier in a cascade structure in combination with several full-wave rectifiers.

The drawbacks of the existing solutions are on one hand that these circuits are sensitive to process variations and on the other hand they are still having a too high current consumption.

Thus, there is a need for an easy to implement limiting amplifier having a low power consumption. Moreover, there is a need for a limiting amplifier having a gain and an input voltage saturation that are independent over the process and the temperature variations.

The present invention is directed towards solving those problems.

SUMMARY OF THE INVENTION

It is thus an object of the present invention to provide a reliable and accurate system that is independent over process and temperature variations.

Another object of the invention is to provide a small area system suitable for implementation into nowadays integrated circuits.

Still another object of the invention is to decrease the power consumption.

In view of the foregoing and other problems of the conventional systems and methods, these objects are achieved by a system as described in the appended claims.

In a preferred embodiment, the limiting amplifier comprises a differential amplifying stage combined with a differential output stage. The differential amplifying stage comprises first and second input transistors having:

first and second input terminals coupled to a differential input voltage, first and second high terminals respectively coupled to a high power supply through first and second load means, and first and second low terminals respectively coupled to a low power supply through first and second current source means.

The differential output stage comprises third and fourth input transistors having:

third and fourth input terminals respectively connected to the first and second high terminals, differential output terminals respectively connected to third and fourth current source means, and high terminals connected to the high power supply.

The system is characterized in that a first resistor means is connected between the first and the second low terminals of the differential amplifying stage, and a second resistor means is connected between the differential output terminals of the differential output stage, thereby providing a gain equal to the ratio of the two resistor means.

In an improved embodiment, a first and a second operational amplifier means are coupled to the input of the differential amplifying stage.

In application, the system is preferably used in conjunction with a full wave rectifier arrangement coupled to the first and the second high terminals of the differential amplifying stage.

To achieve a logarithm function, a plurality of series connected limiting amplifiers and full wave rectifiers are chained for providing an output signal representative of the logarithm of an input signal.

BRIEF DESCRIPTION OF THE DRAWINGS

The above and other objects, features and advantages of the invention will be better understood by reading the following more particular description of the invention in conjunction with the accompanying drawings wherein.

DETAILED DESCRIPTION OF THE INVENTION

The present invention in its preferred embodiment is made of a limiting amplifier that provides a gain and an input voltage saturation that are independent over the process and the temperature variations. A full wave rectifier is encapsulated within the limiting amplifier to offer a simplified and densely packaged design.

Figure 1:
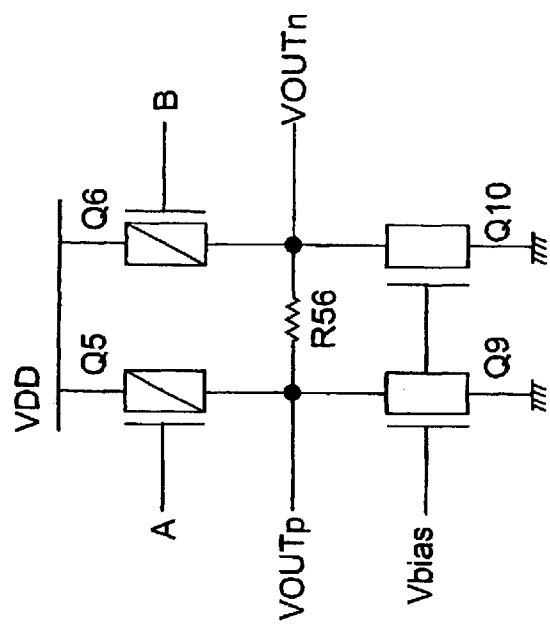
FIG. 1 is a schematic diagram of a limiting amplifier of the preferred embodiment of the present invention.
Figure 1:
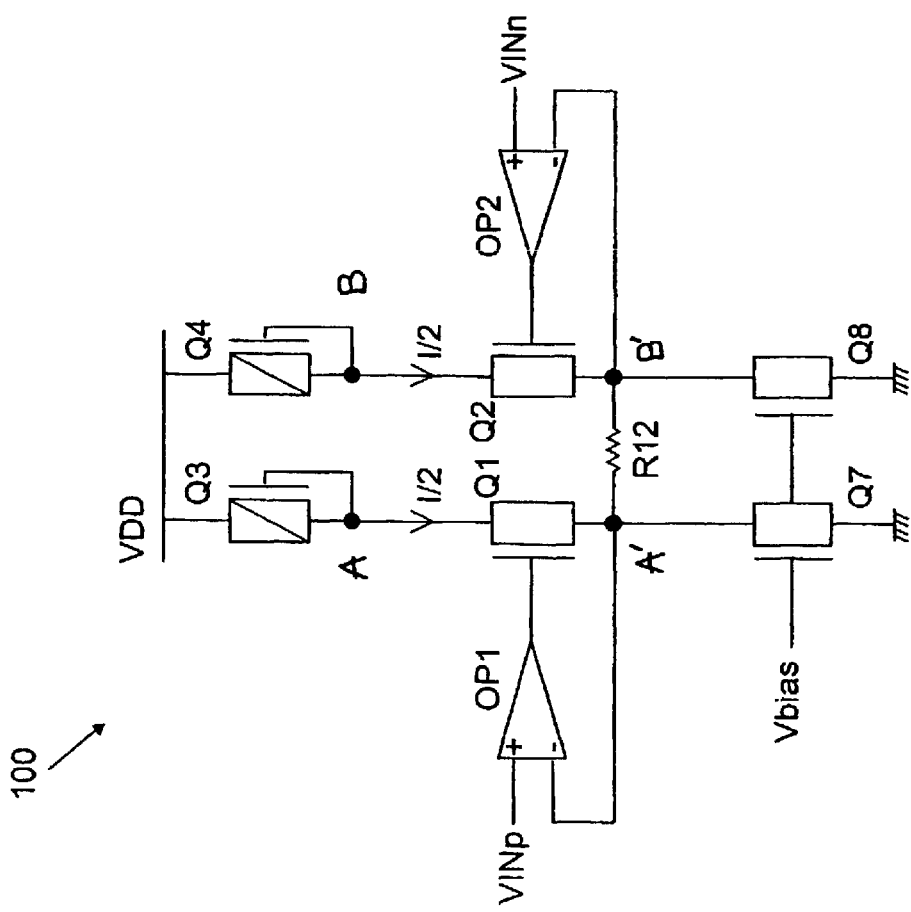

Referring first to FIG. 1, a representative circuit diagram of an individual limiting amplifier of the present invention is described. In this embodiment, transistors Q1 and Q2 are matched transistors, transistors Q3 and Q5 are matched transistors, transistors Q4 and Q6 are matched transistors, transistors Q7, Q8, Q9 and Q10 are matched transistors, operational amplifiers OP1 and OP2 are matches devices.

The N-channel transistors Q7, Q8, Q9 and Q10 are biased by a bias voltage 'Vbias' applied to the gate of each transistor to act as equal current source for each of the four branches of the amplifier. A differential input signal 'VINp' and 'VINn' is provided respectively to the positive/non-inverted input of each operational amplifier OP1 and OP2. It is to be noted that the operational amplifiers are not fully detailed herein as any conventional operational amplifier could be implemented.

The output of each operational amplifier is connected to the gate of the N-channel transistors Q1 and Q2 respectively. The negative/inverted input of each operational amplifier is connected to the source A' and B' at transistors Q1 and Q2 respectively. Transistors Q1 and Q2 form a differential input pair having their source terminal A' and B' respectively connected to the current source provided by transistors Q7 and Q8. Resistance R12 couples the sources of transistors Q1 and Q2. The drain of transistors Q1 and Q2 is connected to a positive power supply VDD through transistors Q3 and Q4 respectively. Transistors Q3 and Q4 are P-channel devices that are drain-gate connected to act as current mirror with transistors Q5 and Q6. The intermediate connection point between transistors Q1 and Q3 is denoted 'A' and the intermediate connection point between transistors Q2 and Q4 is denoted 'B'.

Point 'A' is coupled to the gate of P-channel transistor Q5, while point 'B' is coupled to the gate of P-channel transistor Q6 to copy the current flowing through Q1 into transistor Q5, and the current flowing through Q2 into transistor Q6 respectively. The sources of transistors Q5 and Q6 are supplied by the positive power supply VDD. The drain of transistors Q5 and Q6 is connected to the drain of transistors Q9 and Q10 respectively. Resistance R56 couples the sources of transistors Q5 and Q6. The outputs 'VOUTp' and 'VOUTn' of the limiting amplifier are taken at each end of the resistance R56, 'VOUTp' being designated for the output voltage at the source of transistor Q5, and 'VOUTn' being designated for the output voltage at the source of transistor Q6.

In operation, the differential input voltage 'VINp–VINn' applied at the operational amplifiers inputs is transmitted at the terminals of resistance R12.

A current 'IR12' flowing in the resistance R12 is equally divided in a current flowing into each drain of transistors Q1 and Q2.

The differential configuration of transistors Q1 and Q2 provides a current in resistance R12 equal to:

$$IR12 = \frac{VINp - VINn}{R12} \quad (1)$$

The current mirror arrangement of transistors Q3 and Q4 allows the divided current to equally flow into each branch of transistors Q5 and Q6. Finally, a current 'IR56' that is equal to the current IR12 flows into resistance R56, With such arrangement the differential output voltage is equal to $$VOUTn - VOUTp = IR56 \times R56 \quad (2)$$

which yields by application of equation (1) to:

$$VOUTp - VOUTn = \frac{VINp - VINn}{R12} \times R56 \quad (3)$$

Then the gain of the limiting amplifier is equal to:

$$Gain = \frac{VOUTp - VOUTn}{VINp - VINn} \quad (4)$$

With equation (3), it appears that the gain is equal to:

$$Gain = \frac{R56}{R12} \quad (5)$$

Thus, the proposed arrangement leads to a constant gain ratio thereby providing a gain circuit that is independent over the process and the temperature variations. In a commercial application, the resistance's ratio is fixed to 4 and thus the gain of the circuit is equal to 16 dB.

The gain is constant for a small differential input voltage, but saturates at a saturation voltage 'Vsat' when the differential input voltage becomes too important. The reason is that the current which flows through transistor Q1 (respectively Q2) can not be less than zero, and thus the current which flows through transistor Q2 (respectively Q1) can not be greater than two times the reference current 'Iref' that flows through transistor Q7 (respectively Q8). So the differential current IR12 can not be greater than 2×Iref. By application of equation (1), it results that for VINp–VINn>R12×2×Iref, the current IR12 is constant and is equal to 2×Iref. Then the output of the circuit is equal to VOUTp–VOUTn=2×Iref×R56 by application of equations (2) and (3). By using a reference current 'Iref' of the type 'Vgap/R', then the voltage saturation is:

$$Vsat = R12 \times 2 \times Iref = R12 \times 2 \times \frac{Vgap}{R} \quad (6)$$

Thus, the proposed arrangement leads to a saturation voltage that is a constant value which is independent over the process and the temperature variations.

The skilled person will readily appreciate that this arrangement allows one to easily cascade several amplifiers to realise a logarithm amplifier, the output voltage of a previous stage being fully compatible with the input voltage of a next stage.

In an alternate embodiment, a Common Mode Feed Back circuit as well known in the art should be coupled to resistance R56 and to the Q9 and Q10 transistors to set the operating point of the differential output VOUTp and VOUTn of the amplifier.

To realize the logarithm function by successive approximation, the limiting amplifier of the present invention is used in combination with a full wave rectifier. Various designs of full wave rectifiers are available in the literature, such as for example in U.S. Pat. No. 4,571,502 to Kimura et al. or in U.S. Pat. No. 5,349,521 to Menegoli et al., but none would offer the simplicity and the independence over the process and the temperature variations as the one proposed in the present invention.

The full wave rectifier of the preferred embodiment is now described with reference to FIG. 2. The full wave rectifier is composed of two load transistors Q11 and Q12, two current sources Q13 and Q14, two diodes D1 and D2. The current sources are preferably two N-channel transistors that are biased by the Vbias voltage already applied to the current source of the limiting amplifier. Transistors Q11 and Q12 are used and arranged like transistors Q5 and Q6, in order to copy the current from transistor Q1 into transistor Q11, respectively from transistor Q2 into transistor Q12. The intermediate connection point between Q11 and Q13 and between Q12 and Q14 is called 'C' and 'D' respectively.

A first diode D1 is connected in direct mode between the intermediate point 'C' and the rectified current output 'Iout', while a second diode D2 is connected in direct mode between the intermediate point 'D' and the rectified current output 'IOUT'.

In operation, D1 and D2 act as a one way flowing current, so even if the differential current IR12 is positive or negative, the current flowing into RD is positive. And it can be given that:

$$IOUT = \frac{val \cdot \text{abs}(VINp - VINn)}{R12} \quad (7)$$

Figure 2:
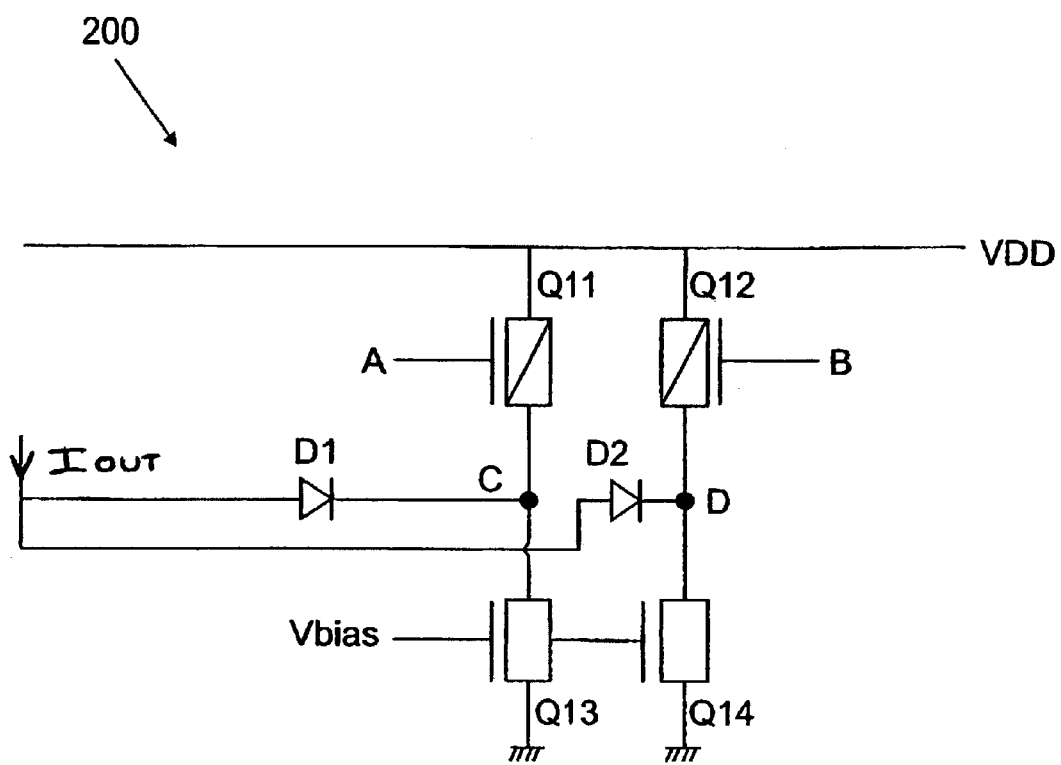
FIG. 2 is a schematic diagram of a full wave rectifier to be used with the limiting amplifier of FIG. 1.
Figure 3:
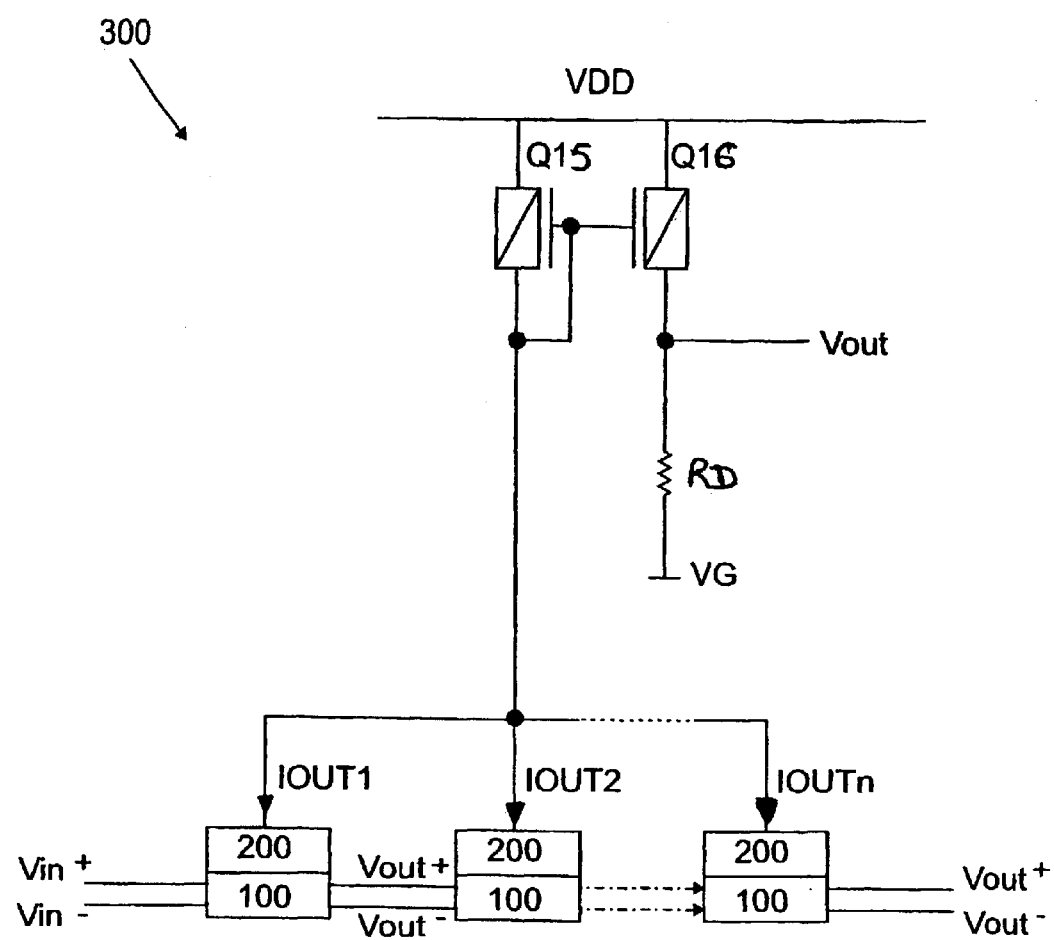
FIG. 3 is a block diagram of the combined use of the circuits of FIGS. 1 and 2.

FIG. 3 shows a block diagram of a chain of combined circuits of FIGS. 1 and 2 in a cascade connection. As can be seen on the figure, each gain stage is composed of a limiting amplifier of the type 100 combined with a full wave rectifier of the type 200. The output of the first stage becomes the input of the second stage, and so on for the number of stages required by the application. It is to be appreciated that no voltage adaptation is required between each stage as the output of the limiting amplifier is directly compatible with the input of the next stage.

The current outputs (IOUT1 to IOUTn) of each full wave rectifier are summed through a current mirror illustrated by transistors Q15 and Q16. The summing current flows in an output resistor 'RD' to deliver the output logarithmic function 'VOUT'.

In operation, for a small differential input voltage, the voltage at RD terminals is equal to:

$$VOUT = \Big[(VINp - VINn) \times \frac{1}{R12} + $$
$$(VINp - VINn) \times \frac{R56/R12}{R12} + \ldots + (VINp - VINn) \times \frac{(R56/R12)^{n-1}}{R12} + $$
$$(VINp - VINn) \times \frac{(R56/R12)^n}{R12} \Big] \times RD$$

Thus it is appreciated that:

$$VOUT \approx \Big[(VINp - VINn) \times \frac{(R56/R12)^n}{R12}\Big] \times RD.$$

When $(VINp - VINn) \times (R56/R12)^n > Vsat$, then $$VOUT = \Big[(VINp - VINn)\frac{1}{R12} + (VINp - VINn) \times \frac{(R56/R12)}{R12} + $$
$$\ldots + (VINp - VINn) \times \frac{(R56/R12)^{n-1}}{R12} + 2 \times Iref \Big] \times RD.$$

Thus $VOUT \approx \Big[(VINp - VINn) \times \frac{(R56/R12)^{n-1}}{R12}\Big] \times RD.$ And when $(VINp - VINn) \times (R56/R12)^2 > Vsat$, then $$VOUT = \Big[(VINp - VINn) \times \frac{1}{R12} + $$
$$(VINp - VINn) \times \frac{(R56/R12)}{R12} + \ldots + 2 \times Iref + 2 \times Iref\Big] \times RD.$$

Thus it is appreciated that:

$$VOUT \approx \Big[(VINp - VINn) \times \frac{(R56/R12)^1}{R12}\Big] \times RD.$$

As demonstrated, the chain is acting as a gain chain with a high gain value for small differential input voltage, and a low gain value for large differential input voltage. This is to realize a logarithm function by successive gain limitation.

Again, as previously demonstrated, the gain of each stage is equal to $$Gain = \frac{R56}{R12} \quad (5)$$

so the gain is independent in the process and temperature variations. Also the successive input saturation voltages are proportional to 'Vsat', which is also independent in the process and temperature variations.

The skilled person will easily understand that to realize a commercial logarithm function, it would be appropriate to include an offset cancellation arrangement in the cascade structure of FIG. 3, in order to avoid any offset caused by device mismatch. However, no specific offset cancellation circuit is proposed herein as any prior art circuit could be adapted.

It is to be appreciated by those skilled in the art that while the invention has been particularly shown and described with reference to a preferred embodiment thereof, various changes in form and details may be made without departing from the spirit and scope of the invention. In particular, the differential input signals 'VINp' and 'VINn' could be applied directly to the input gates of transistors Q1 and Q2, without the use of the operational amplifiers OP1 and OP2.

What is claimed is:

1. A limiting amplifier comprising:
  (1) a differential amplifying stage comprising first and second input transistors having:
    (a) first and second input terminals coupled to a differential input voltage,
    (b) first and second high terminals respectively coupled to a high power supply through first and second load means, and
    (c) first and second low terminals respectively coupled to a low power supply through first and second current source means; and
  (2) a differential output stage comprising a third and fourth input transistors having:
    (a) third and fourth input terminals respectively connected to the first and second high terminals,
    (b) differential output terminals respectively connected to third and fourth current source means, and
    (c) high terminals connected to the high power supply;
  wherein said differential amplifying stage further comprises a first resistor means connected between said first and second low terminals;
  and said differential output stage further comprises a second resistor means connected between said differential output terminals.

2. The system of claim 1 wherein said differential amplifying stage further comprises first and second operational amplifier means having:

non inverting input terminals coupled to the differential input voltage respectively, inverting input terminals connected to the first and second low terminals respectively, and output terminals connected to the first and second input terminals of the first and second input transistors respectively.

3. The system of claim 1 wherein said first, second, third and fourth current sources are matched transistors biased at the same bias voltage to draw a reference current of the type Iref=Vgap/R.

4. The system of claim 1 wherein the first and second input transistors are N-channel FET and the third and fourth input transistors are P-channel FET.

5. The system of claim 1 wherein the ratio of the second resistor means over the first resistor means is equal to four.

6. The system of claim 1 further comprising a full wave rectifier arrangement coupled to said first and second high terminals.

7. The system of claim 6 wherein the full wave rectifier arrangement further comprises:

a fifth and sixth input transistors having:

fifth and sixth input terminals respectively connected to the first and second high terminals, differential fifth and sixth output terminals respectively connected to fifth and sixth current source means, and high terminals connected to the high power supply;

wherein the fifth and sixth output terminals are coupled to a rectified current output through direct diodes respectively.

8. The system of claim 7 wherein the fifth and sixth input transistors are P-channel FET.

9. A logarithm amplifier and limiter device for providing an output signal representative of the logarithm of an input signal comprising a plurality of series connected limiting amplifiers according to claim 6.

10. The system of claim 1 further comprising an offset cancellation arrangement.

* * * * *